(12) United States Patent
Coln et al.

(10) Patent No.: US 9,083,369 B2
(45) Date of Patent: Jul. 14, 2015

(54) SPLIT-PATH DATA ACQUISITION SIGNAL CHAIN

(71) Applicant: ANALOG DEVICES, INC., Norwood, MA (US)

(72) Inventors: Michael Coln, Lexington, MA (US); Lalinda D. Fernando, Westford, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 13/891,988

(22) Filed: May 10, 2013

(65) Prior Publication Data

US 2014/0333463 A1 Nov. 13, 2014

(51) Int. Cl.
*H03M 1/12* (2006.01)

(52) U.S. Cl.
CPC ...................................... *H03M 1/12* (2013.01)

(58) Field of Classification Search
CPC ................. H03M 1/12; H03M 1/124
USPC ..................... 341/155, 156, 122, 61
See application file for complete search history.

(56) References Cited

U.S. PATENT DOCUMENTS

| | | | |
|---|---|---|---|
| 4,937,579 A * | 6/1990 | Maio et al. | 341/165 |
| 5,034,698 A | 7/1991 | Moriyasu | |
| 6,342,850 B1 * | 1/2002 | Borer et al. | 341/156 |
| 6,411,750 B1 * | 6/2002 | Fishman et al. | 385/11 |
| 6,791,382 B1 * | 9/2004 | Ting et al. | 327/156 |
| 6,825,789 B1 * | 11/2004 | Stewart et al. | 341/155 |
| 7,576,665 B2 * | 8/2009 | Bettin et al. | 341/110 |
| 7,924,959 B2 * | 4/2011 | Jungerman et al. | 375/354 |
| 8,098,181 B2 | 1/2012 | Roach | |
| 8,224,274 B2 * | 7/2012 | Gomez et al. | 455/179.1 |
| 2005/0140388 A1 | 6/2005 | Conner | |

* cited by examiner

*Primary Examiner* — Peguy Jean Pierre

(57) ABSTRACT

The present disclosure provides for split-path data acquisition chains and associated signal processing methods. An exemplary integrated circuit for providing a split-path data acquisition signal chain includes an input terminal for receiving an analog signal; an output terminal for outputting a digital signal; and at least two frequency circuit paths coupled with the input terminal and the output terminal, wherein the at least two frequency circuit paths are configured to process different frequency components of the analog signal and recombine the processed, different frequency components, thereby providing the digital signal.

21 Claims, 4 Drawing Sheets

SPLIT-PATH DATA ACQUISITION SIGNAL CHAIN

TECHNICAL FIELD

The present disclosure relates generally to data acquisition signal chains and associated signal processing methods, and more particularly, to split-path data acquisition signal chains and associated processing methods.

BACKGROUND

A data acquisition system is an electronic device that typically converts an analog signal into a digital form for processing. The analog signal represents real world physical conditions. In some implementations, a data acquisition system includes various components for forming a data acquisition signal chain for processing the analog signal, such as a sensor for converting the physical conditions to the analog signal, signal conditioning circuitry to convert the analog signal into a form that can be converted into digital form, and an analog-to-digital converter for converting the conditioned analog signal into a digital signal that can be stored and/or analyzed, for example, by a computer. Oftentimes, the analog signal spans a significant frequency range (for example, the analog signal includes both high AC frequency components and DC frequency components), such that the components of the data acquisition signal chain are configured to best optimize processing for the wide range of frequencies, as opposed to individually optimizing processing for individual frequency components. Such configuration can limit performance, particularly for mixed signal applications. Accordingly, although existing data acquisition signal chains have been generally adequate for their intended purposes, they have not been entirely satisfactory in all respects.

BRIEF DESCRIPTION OF DRAWINGS

The present disclosure is best understood from the following detailed description when read with the accompanying figures. It is emphasized that, in accordance with the standard practice in the industry, various features are not drawn to scale and are used for illustration purposes only. In fact, the dimension of the various features may be arbitrarily increased or reduced for clarity of discussion.

OVERVIEW OF EXAMPLE EMBODIMENTS

Figure 1:
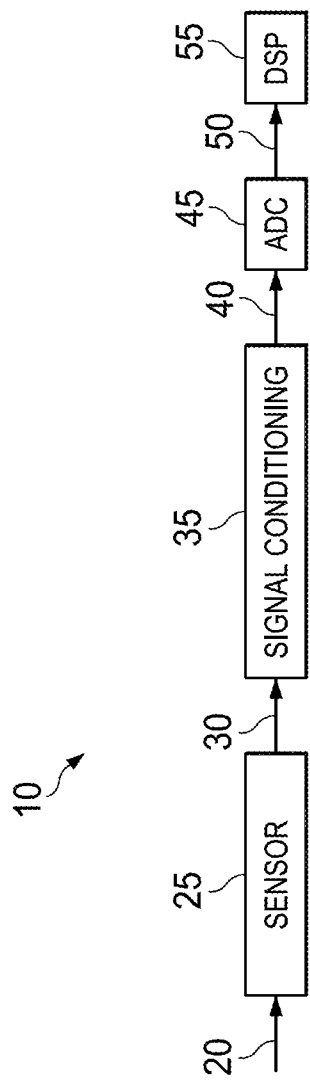
FIG. 1 is a simplified block diagram of an exemplary data acquisition signal system according to various aspects of the present disclosure.

The present disclosure provides split-path data acquisition signal chains and associated methods for signal processing. An exemplary integrated circuit that can form a split-path data acquisition signal chain includes an input terminal for receiving an analog signal; an output terminal for outputting a digital signal; and at least two frequency circuit paths coupled with the input terminal and the output terminal, wherein the at least two frequency circuit paths are configured to process different frequency components of the analog signal and recombine the processed, different frequency components, thereby providing the digital signal. In various implementations, the at least two frequency circuit paths include a first frequency circuit path coupled with the input terminal and the output terminal, wherein the first frequency circuit path is configured to process a first frequency component of the analog signal; and a second frequency circuit path coupled with the input terminal and the output terminal, wherein the second frequency circuit path is configured to process a second frequency component of the analog signal. In various implementations, the first frequency component includes an AC frequency component and the second frequency component includes a DC frequency component. In various implementations, the input terminal is configured to receive a differential analog signal.

The first frequency circuit path can be a capacitor-based circuit, and the second frequency circuit path can be a resistor-based circuit. In various implementations, the capacitor-based circuit includes a capacitive feedback amplifier. The capacitive feedback amplifier can include an operational amplifier having an inverting input, a non-inverting input, and an output; a first capacitor coupled with the input terminal and the inverting input; and a second capacitor coupled with the inverting input and the output. The capacitive feedback amplifier can further include a switched capacitor "resistor" coupled with the inverting input. In various implementations, the capacitor-based circuit further includes an analog-to-digital converter coupled with the capacitive feedback amplifier. The resistor-based circuit can include a resistor divider. In various implementations, the resistor-based circuit further includes an analog-to-digital converter coupled with the resistor divider.

Another exemplary integrated circuit includes an input terminal for receiving an analog signal; an output terminal for receiving a digital signal; a capacitive-based circuit coupled with the input terminal and the output terminal, wherein the capacitive-based circuit is configured to process a first frequency component of the analog signal; and a resistive-based circuit path coupled with the input terminal and the output terminal, wherein the resistive-based circuit path is configured to process a second frequency component of the analog signal. The capacitive-based circuit and the resistive-based circuit are coupled such that the processed first frequency component and the processed second frequency component are combined to provide the digital signal. In various implementations, the first frequency component includes a high AC frequency component of the analog signal and the second frequency component includes a DC frequency component of the analog signal. In various implementations, the second frequency component further includes a low AC frequency component of the analog signal.

In various implementations, the capacitive-based circuit includes a capacitive feedback amplifier, and a first analog-to-digital converter coupled with the capacitive feedback amplifier. In various implementations, the resistive-based circuit path includes a resistor divider, and a second analog-to-digital converter coupled with the resistor divider. The capacitive-based circuit can further include a scaling component coupled with the first analog-to-digital converter; and the resistive-based circuit can further include a low pass filter coupled with the second analog-to-digital converter. In various implementations, the capacitive-based circuit further includes a switched-capacitor resistor coupled with the capacitive feedback amplifier, where the switched-capacitor resistor and the low pass filter are configured to operate on a commensurate clock frequency. In various implementations, the capacitive feedback amplifier is a programmable gain amplifier. In various implementations, the input terminal is configured to receive a differential analog signal.

An exemplary method to be performed by an integrated circuit, such as those described herein, includes receiving an analog signal that includes at least two frequency signal components; separately processing the at least two frequency signal components; and providing a digital signal by combining the at least two processed frequency signal components. In various implementations, the at least two frequency signal components include an AC signal component and a DC signal component.

DETAILED DESCRIPTION OF EXAMPLE EMBODIMENTS

The following disclosure provides many different embodiments, or examples, for implementing different features of the present disclosure. Specific examples of components and arrangements are described below to simplify the present disclosure. These are, of course, merely examples and are not intended to be limiting. Further, the present disclosure may repeat reference numerals and/or letters in the various examples. This repetition is for the purpose of simplicity and clarity and does not in itself dictate a relationship between the various embodiments and/or configurations discussed.

FIG. 1 is a schematic block diagram of an exemplary data acquisition system 10 according to various aspects of the present disclosure. The data acquisition system 10 is an electronic device (including an electronic circuit and/or one or more components) configured to convert signals (such as analog signals) into a digital form. In particular, the data acquisition system 10 converts physical conditions into digital form, which can be stored and/or analyzed. In FIG. 1, the data acquisition system 10 includes an input signal 20 that represents a physical quantity, such as temperature, pressure, velocity, flow rate, position, other physical quantity, or a combination thereof. A sensor block 25 receives the input signal 20 and converts the physical quantity (represented by the input signal 20) into an electrical signal, such as an analog signal 30. The analog signal 30 can be a voltage or current that represents the physical quantity (represented by the input signal 20). A signal conditioning block 35 receives and adjusts the analog signal 30 within an acceptable range of an analog-to-digital converter, such as that provided at analog-to-digital converter (ADC) block 45, thereby providing conditioned analog signal 40. The signal conditioning block 35 can amplify, attenuate, filter, and/or perform other functions to the analog signal 30. The ADC block 45 receives and converts the conditioned analog signal 40 into digital form, thereby providing digital signal 50. The digital signal 50 represents the physical quantity received by the sensor via incoming signal 20. A digital signal processor (DSP) 55 receives and processes the digital signal 50. FIG. 1 has been simplified for the sake of clarity to better understand the inventive concepts of the present disclosure. Additional features can be added in the data acquisition system 10, and some of the features described below can be replaced or eliminated in other embodiments of the data acquisition system 10.

Figure 2:
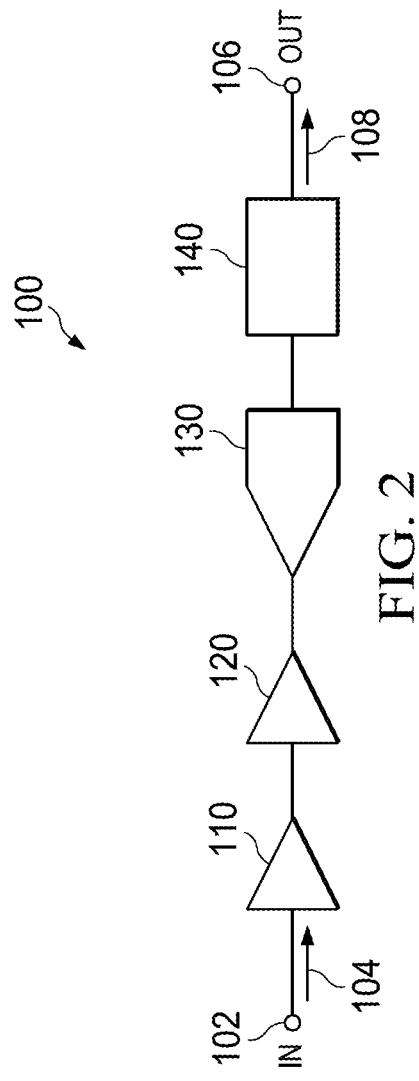
FIG. 2 is a simplified block diagram of an exemplary integrated circuit that provides a data acquisition signal chain according to various aspects of the present disclosure.

FIG. 2 is a schematic block diagram of an exemplary integrated circuit 100 according to various aspects of the present disclosure. The integrated circuit 100 forms a single data acquisition signal chain. In various implementations, the integrated circuit 100 is an electronic device (including an electronic circuit and/or one or more components) configured to convert signals (such as analog signals) into a digital form. The integrated circuit 100 can thus alternatively be referred to as a data acquisition system. FIG. 2 has been simplified for the sake of clarity to better understand the inventive concepts of the present disclosure. Additional features can be added in the integrated circuit 100, and some of the features described below can be replaced or eliminated in other embodiments of the integrated circuit 100.

The integrated circuit 100 has an input terminal 102 that receives an input signal 104 and an output terminal 106 that outputs an output signal 108. In the depicted embodiment, the input signal 104 is an analog signal having various frequency components, for example, an AC (alternating current) frequency component and a DC (direct current) frequency component; and the output signal 108 is a digital signal. The integrated circuit 100 processes the input signal 104 to provide the output signal 108 in digital form to the output terminal 106. The input terminal 102 can be coupled with a source (for example, a source circuit). In various implementations, the source is a sensor that supplies the input signal 104, where the input signal 104 is an analog signal that represents a physical quantity, such as temperature, pressure, velocity, flow rate, position, other physical quantity, or a combination thereof. The output terminal 106 can be coupled with a load (such as a load circuit). In various implementations, the load is a digital signal processor that receives the output signal 108. It is noted that, in various implementations, the input terminal 102 can include more than one input connection (for example, a pair of input connections) for carrying a differential input signal. Further, the output terminal 106 can include more than one output connection (for example, a pair of output connections) for carrying a differential output signal.

In the depicted embodiment, the integrated circuit 100 forms a single path data acquisition signal chain that processes the input signal 104 (here, an analog signal over a range for frequencies) to provide output signal 108 (here, a digital signal over a range of frequencies). For example, the integrated circuit 100 includes an amplifier 110, an amplifier 120, an analog-to-digital converter (ADC) 130, and a filter 140. The amplifier 110 and the amplifier 120 condition the input signal 104, such that the input signal 104 is within an acceptable range for processing by the ADC 130. In the depicted embodiment, the amplifier 110 is an instrumentation amplifier that conditions the signal, and the amplifier 120 is a programmable gain amplifier that buffers and amplifies the signal. Once the signal is conditioned and within an acceptable range for processing, the ADC 130 converts the conditioned, analog signal into an equivalent digital signal. The filter 140 receives and filters, depending on design requirements of the integrated circuit 100, the equivalent digital signal to provide the digital, output signal 208.

As noted, the analog, input signal 104 can include various frequency components, ranging from high AC frequency components to DC frequency components. The integrated circuit 100 (and more particularly, the amplifier 110, amplifier 120, ADC 130, and filter 140) are thus configured to optimize signal processing for the various frequency components within a given frequency bandwidth. Because each component of the integrated circuit 100 must adequately process the given frequency bandwidth, optimal signal processing for the individual frequency components may not be realized, leading to less than desirable signal processing in particular applications, such as instrumentation and industrial applications. For example, in some applications, signals may have a dynamic range exceeding 120 dB, including DC frequency components. Further, signal voltages can be bipolar, often exceeding limited power supply voltages implemented by the integrated circuit 100. Though the integrated circuit 100 provides adequate processing for such application, improvements for mixed-signal processing are desired. The following describes various integrated circuits that can achieve signal processing improvements by implementing data acquisition signal chains that separately optimize processing for the various frequency components.

Figure 3:
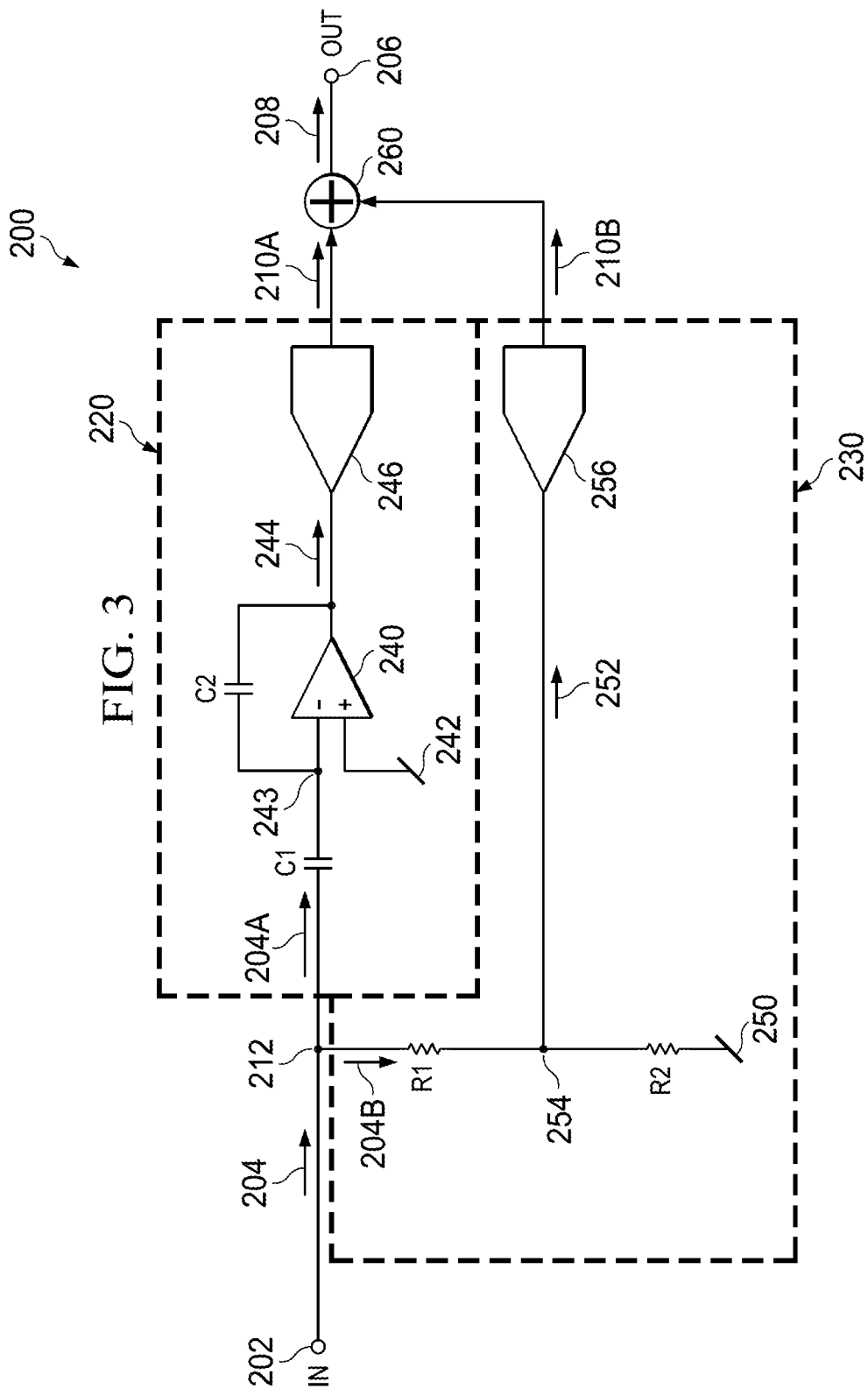
FIG. 3 is a simplified block diagram of an exemplary integrated circuit that provides a split-path data acquisition signal chain according to various aspects of the present disclosure.

FIG. 3 is a schematic block diagram of an exemplary integrated circuit 200 according to various aspects of the present disclosure. The integrated circuit 200 forms a data acquisition signal chain, in particular, a split-path data acquisition signal chain. In various implementations, the integrated circuit 200 is an electronic device (including an electronic circuit and/or one or more components) configured to convert signals (such as analog signals) into a digital form. The integrated circuit 200 can thus alternatively be referred to as a data acquisition system. FIG. 3 has been simplified for the sake of clarity to better understand the inventive concepts of the present disclosure. Additional features can be added in the integrated circuit 200, and some of the features described below can be replaced or eliminated in other embodiments of the integrated circuit 200.

The integrated circuit 200 has an input terminal 202 that receives an input signal 204 and an output terminal 206 that outputs an output signal 208. In the depicted embodiment, the input signal 204 is an analog signal having various frequency components, for example, an AC (alternating current) frequency component and a DC (direct current) frequency component; and the output signal 208 is a digital signal. The integrated circuit 200 processes the input signal 204 to provide the output signal 208 in digital form to the output terminal 206. The input terminal 202 can be coupled with a source (for example, a source circuit). In various implementations, the source is a sensor that supplies the input signal 204, where the input signal 204 is an analog signal that represents a physical quantity, such as temperature, pressure, velocity, flow rate, position, other physical quantity, or a combination thereof. The output terminal 206 can be coupled with a load (such as a load circuit). In various implementations, the load is a digital signal processor that receives the output signal 208. It is noted that, in various implementations, the input terminal 202 can include more than one input connection (for example, a pair of input connections) for carrying a differential input signal. Further, the output terminal 206 can include more than one output connection (for example, a pair of output connections) for carrying a differential output signal.

The integrated circuit 200 is configured to separate the frequency components of the input signal 204 (here, a frequency component 204A and a frequency component 204B) for processing, and then recombine the processed frequency components (here, represented by an output signal 210A and an output signal 210B) to supply the output signal 208. For example, a frequency circuit path 220 and a frequency circuit path 230 are coupled with the input terminal 202 and the output terminal 206, and configured such that the input signal 204 is separated into the frequency component 204A and the frequency component 204B from node 212. Frequency circuit path 220 processes frequency component 204A, thereby providing output signal 210A, and frequency circuit path 230 processes frequency component 204B, thereby providing output signal 210B. In the depicted embodiment, frequency circuit path 220 is a high frequency circuit path that passes high frequencies, and frequency circuit path 230 is a low frequency circuit path that passes low frequencies (frequencies lower than the frequencies passed by the frequency circuit path 220). For example, frequency circuit path 220 processes an AC frequency component, such as high AC frequencies, of the input signal 204, and frequency circuit path 230 processes a DC frequency component of the input signal 204. In furtherance of the present example, frequency circuit path 230 can further process an AC frequency component, such as low AC frequencies (frequencies between the DC frequency component and the high AC frequency component). Accordingly, in the present example, frequency component 204A represents the high AC frequency component of the input signal 204, and frequency component 204B represents the DC and low AC frequency component of the input signal 204.

The frequency circuit path 220 includes a capacitor-based circuit that processes frequency component 204A of the input signal 204 (here, the high frequency component, which can include high AC frequencies). For example, frequency circuit path 220 includes a capacitive feedback amplifier (alternatively referred to as a capacitive attenuator). The capacitive feedback amplifier includes an amplifier 240, such as an operational amplifier. In the present example, the amplifier 240 has an inverting input coupled with the node 212 (and the input terminal 202) and a non-inverting input coupled with a voltage reference terminal 242 (for example, a ground terminal). The capacitive feedback amplifier further includes a capacitor C1 coupled with the node 212 and the inverting input of the amplifier 240, and a capacitor C2 coupled with the inverting input and the output of the amplifier 240. The capacitor C1 is coupled with the capacitor C2 at joint node 243. In the depicted embodiment, capacitor C1 can block the DC frequency component while allowing the AC frequency component (particularly the high AC frequency component) to pass through to the amplifier 240, and capacitor C2 (alternatively referred to as a feedback capacitor) can provide feedback from the output to the inverting input of the amplifier 240. In various implementations, the amplifier 240 may be a programmable gain amplifier. The capacitive feedback amplifier receives and conditions (for example, amplifies) the frequency component 204A, thereby providing a conditioned signal 244 to an analog-to-digital converter (ADC) 246. For example, the capacitive feedback amplifier is configured to process the frequency component 204A so that the conditioned signal 244 is an analog signal within an optimum bandwidth range of the ADC 246. The ADC 246 converts the conditioned signal 244 (in the present example, a conditioned, high AC frequency component of the input signal 204) into an equivalent digital signal, output signal 210A, for subsequent processing, such as subsequent digital processing.

Frequency circuit path 220 optimizes processing of frequency component 204A (here, high AC frequency component) of the input signal 204. For example, because the frequency circuit path 220 substantially blocks the amplifier 240 from seeing the frequency component 204B (here, DC frequency component), DC signal variation on the differential input pair of the amplifier 240 can be diminished (or eliminated) so that the differential input pair can operate with a low supply voltage. Such configuration results in minimal noise while providing sufficient power for operation of the amplifier 240. Further, in contrast to conventional configurations that often include an instrumentation amplifier (see FIG. 2) for observing the frequency component 204A, the frequency circuit path 220 can implement a single differential input pair of the amplifier 240 for observing the frequency component 204A, thereby efficiently balancing the consumed power and internal noise levels. Even further, the ADC 246 can be optimized for processing the frequency component passed by frequency circuit path 220, here, frequency component 204A. Since, in the present example, the frequency component 204A does not include the DC frequency component, the ADC 246 is configured to deliver necessary bandwidth without much concern related to offset issues.

The frequency circuit path 230 includes a resistor-based circuit, such that the frequency path circuit 230 processes frequency component 204B of the input signal 204 (here, the low frequency component, which can include the DC frequency component and/or the low AC frequency component). For example, frequency circuit path 230 includes a resistor divider (alternatively referred to as a resistive attenuator) that includes resistor R1 and resistor R2 coupled in series with the node 212 and a voltage reference terminal 250 (for example, a ground terminal). In various implementations, resistor R1 and/or resistor R2 are thin-film resistors. The resistor divider receives and conditions (for example, attenuates) the frequency component 204B, thereby providing a conditioned signal 252 to an analog-to-digital converter (ADC) 256 coupled with the resistor divider, particularly coupled with the junction node 254 between resistor R1 and resistor R2. The resistor divider is configured to process the frequency component 204B so that the conditioned signal 252 is an analog signal within a bandwidth range of the ADC 256. In the depicted embodiment, the resistor divider attenuates (scales) the DC frequency component (and/or low AC frequency component), which is potentially large, such that the conditioned signal 252 has a magnitude suitable for subsequent digitization. The ADC 256 converts the conditioned signal 252 (in the present example, a conditioned, DC and/or low AC frequency component) into an equivalent digital signal, output signal 210B, for subsequent processing, such as subsequent digital processing.

Frequency circuit path 230 optimizes processing of frequency component 204B (here, DC and/or low AC frequency component) of the input signal 204. For example, since the frequency circuit path 230 is configured to process a low bandwidth (here, DC frequency component and/or low AC frequency component), integrated noise from resistor R1 and resistor R2 will not exceed noise budgets, and any parasitic capacitance associated with resistor R1 and resistor R2 will not affect the processing ability of the frequency circuit path 230. In various implementations, the resistive divider (resistor R1 and resistor R2) can be implemented off-chip to achieve higher impedance. Further, the ADC 256 can be optimized for processing frequency component 204B. Since, in the present example, the frequency component 204B includes the DC frequency component, the ADC 256 can be a low bandwidth ADC that implements chopping and/or other approaches to minimize any offset error and/or 1/f noise.

Since the input signal 204 has been separated into more than one frequency component for processing (here, frequency component 204A for processing by frequency circuit path 220 and frequency component 204B for processing by frequency circuit path 230), the integrated circuit 200 is further configured to combine the processed signal components (here, output signal 210A and output signal 210B) so that the output signal 208 accurately represents the input signal 204. For example, the integrated circuit 200 includes a circuit component 260, such as a summer, that combines output signal 210A (in the depicted embodiment, a digital signal representative of the high frequency component of the input signal 204) and output signal 210B (in the depicted embodiment, a digital signal representative of the low frequency component of the input signal 204) to produce the output signal 208 (in the depicted embodiment, a digital signal over a range of frequencies). In various implementations, the circuit component 260 includes a digital addition circuit. In various implementations, a conversion addition of the ADC digital outputs (for example, output signal 201A and output signal 210B) can be performed by conventional digital logic gates, such as a collection of binary full adders. Alternatively, in various implementations, where the integrated circuit 200 includes a microprocessor or microcontroller, the addition can be performed as a software routine performing an arithmetic addition of the ADC digital data (for example, output signal 201A and output signal 210B) on a conversion by conversion basis to deliver a resulting data stream (for example, output signal 208).

By separating the input signal 204 into more than one frequency component, the integrated circuit 200 optimizes signal processing for various frequency components, thereby improving signal processing. In particular, by providing frequency circuit paths optimized for particular frequency components of an analog signal, the integrated circuit 200 can optimize a resulting digital signal, such that it better represents the analog signal. In the depicted embodiment, by having frequency circuit path 220 configured as a capacitive-based circuit and frequency circuit path 230 configured as a resistive-based circuit, the integrated circuit 200 optimizes processing of both high frequency and low frequency components of the input signal 204. Further, the passive inputs of frequency circuit path 220 and frequency circuit path 230 minimize distortion and/or offset error in the processed signals. Frequency circuit path 220 and frequency circuit path 230 can be configured with different, and variable, internal gain to support a higher dynamic range for AC frequency components. The integrated circuit 200 can thus support high DC input impedance while maintaining optimal overall frequency response and minimizing noise. Such configuration can also support input signals (such as input signal 204) that exceed power supply rails and/or processing of differential signals with the common-mode rejected. Different embodiments may have different advantages than those described herein, and no particular advantage is necessarily required of any embodiment.

The integrated circuit 200 can be configured to separate the input signal 204 into more than two frequency components, as in the depicted embodiment, where at least two frequency circuit paths are implemented to process two or more frequency components of the incoming signal 204, each frequency circuit path being optimized for a portion of the frequency spectrum. For example, the integrated circuit 200 can be configured to include frequency circuit path 220 for processing high AC frequencies, frequency circuit path 230 for processing DC frequencies, and another frequency path circuit for processing low AC frequencies. Alternatively, the integrated circuit 200 can be configured with frequency circuit paths optimized for processing different frequency components of the input signal 204, than those described with reference to FIG. 3 and further herein. It is further noted that the integrated circuit 200 is configured as single-ended, yet the present disclosure contemplates configurations where the integrated circuit 200 operates with differential inputs.

Figure 4:
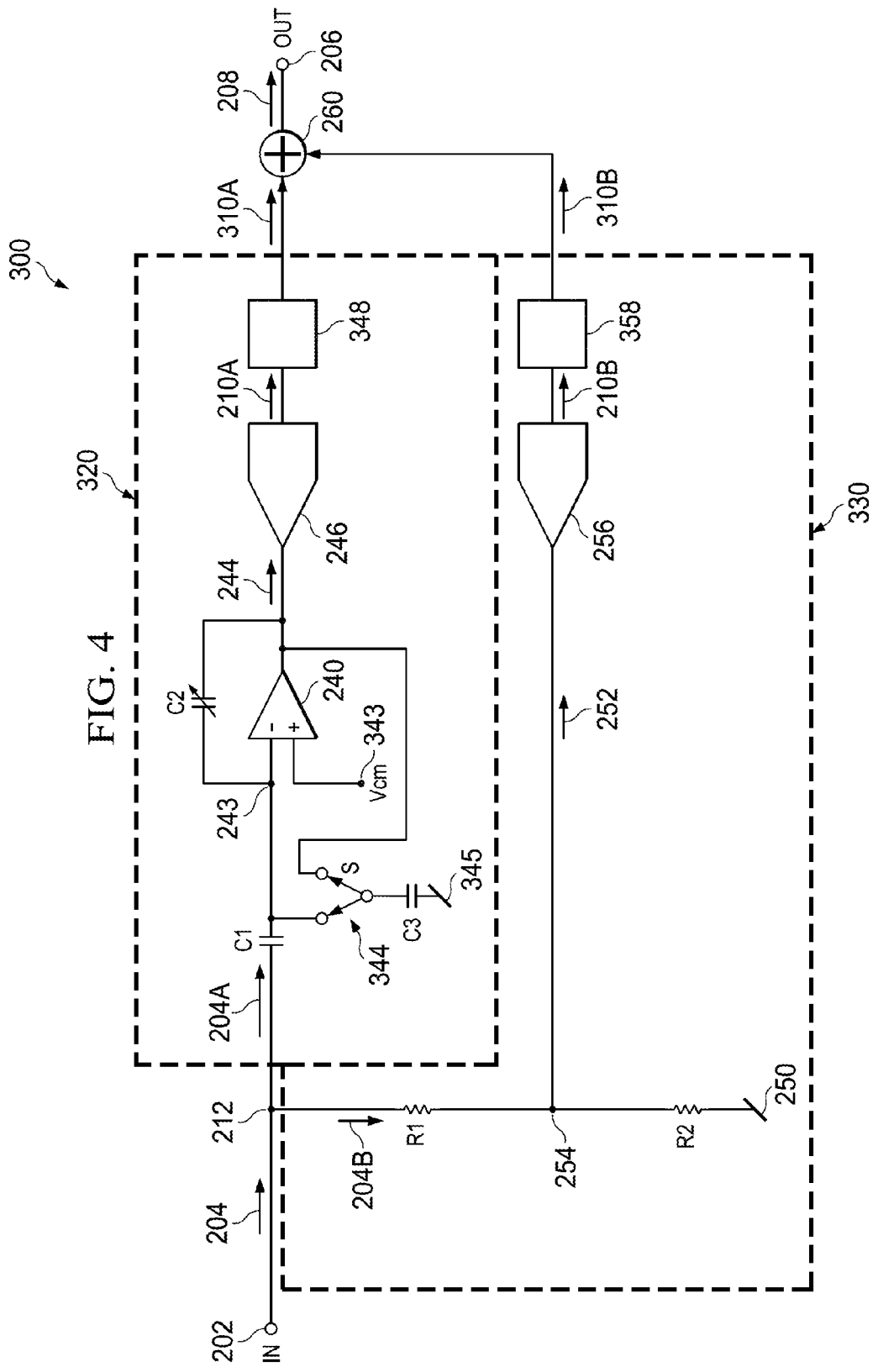
FIG. 4 is a simplified block diagram of another exemplary integrated circuit that provides a split-path data acquisition signal chain according to various aspects of the present disclosure.

FIG. 4 is a schematic circuit diagram of an exemplary integrated circuit 300 according to various aspects of the present disclosure. The integrated circuit 300 forms a data acquisition signal chain, in particular, a split-path data acquisition signal chain. In various implementations, the integrated circuit 300 is an electronic device (including an electronic circuit and/or one or more components) configured to convert signals (such as analog signals) into a digital form. The integrated circuit 300 can thus alternatively be referred to as a data acquisition system. The embodiment of FIG. 4 is similar in many respects to the embodiment of FIG. 3. Accordingly, similar features in FIG. 3 and FIG. 4 are identified by the same reference numerals for clarity and simplicity. FIG. 4 has been simplified for the sake of clarity to better understand the inventive concepts of the present disclosure. Additional features can be added in the integrated circuit 300, and some of the features described below can be replaced or eliminated in other embodiments of the integrated circuit 300.

Similar to the integrated circuit 200, the integrated circuit 300 has the input terminal 202 that receives the input signal 204 and the output terminal 206 that outputs the output signal 208. In the depicted embodiment, the input signal 204 is an analog signal having various frequency components, for example, an AC (alternating current) frequency component and a DC (direct current) frequency component; and the output signal 208 is a digital signal. The integrated circuit 300 processes the input signal 204 to provide the output signal 208 in digital form to the output terminal 206. Further, the integrated circuit 300 is similarly configured to separate the frequency components of the input signal 204 (the frequency component 204A and the frequency component 204B) for processing, and then recombine the processed frequency components (here, an output signal 310A and an output signal 310B) to supply the output signal 208 to output terminal 206. For example, a frequency circuit path 320 and a frequency circuit path 330 are coupled with the input terminal 202 and the output terminal 206, and configured such that the input signal 204 is separated into the frequency component 204A and the frequency component 204B from node 212. Frequency circuit path 320 processes frequency component 204A, thereby providing output signal 310A, and frequency circuit path 330 processes frequency component 204B, thereby providing output signal 310B. In the depicted embodiment, frequency circuit path 320 is a high frequency circuit path that passes high frequencies and frequency circuit path 330 is a low frequency circuit path that passes low frequencies (frequencies lower than the frequencies passed by the frequency circuit path 320). For example, frequency circuit path 320 processes an AC frequency component, such as a high AC frequency component, of the input signal 204, and frequency circuit path 330 processes a DC frequency component of the input signal 204. In furtherance of the present example, frequency circuit path 330 can further process an AC frequency component, such as a low AC frequency component (frequencies between the DC frequency component and the high AC frequency component). Accordingly, in the present example, frequency component 204A represents the high AC frequency component of the input signal 204, and frequency component 204B represents the DC and low AC frequency component of the input signal 204.

The frequency circuit path 320 is similar to the frequency circuit path 220 in many respects. For example, frequency circuit path 320 includes the capacitor-based circuit that processes frequency component 204A (here, the high frequency component, which can include high AC frequencies) of the input signal 204. For example, frequency circuit path 320 includes the capacitive feedback amplifier that includes the amplifier 240. The capacitive feedback amplifier further includes the capacitor C1 coupled with the node 212 and the inverting input of the amplifier 240, and the capacitor C2 coupled with the inverting input and the output of the amplifier 240. The capacitor C1 and capacitor C2 are similarly coupled with one another at the node 243. In the depicted embodiment, capacitor C1 can block the DC frequency component while allowing the AC frequency component (particularly the high AC frequencies) to pass through to the amplifier 240, and capacitor C2 can provide feedback from the output of the amplifier 240 to the inverting input of the amplifier 240.

In contrast to frequency circuit path 220, in frequency circuit path 320, the amplifier 240 is an operational amplifier having the inverting input coupled with the node 212 and the non-inverting input coupled with a voltage reference terminal 343. In the present example, the voltage reference terminal 343 is set at a common-mode voltage (Vcm) of the amplifier 240. Alternatively, the voltage reference terminal 343 is a ground terminal. In the depicted embodiment, the amplifier 240 is a programmable gain amplifier. The capacitive feedback amplifier further includes circuitry for establishing a DC operating potential at the input of the amplifier 240. For example, in the depicted embodiment, the frequency circuit path 320 further includes a switched-capacitor "resistor" 344. The switched-capacitor "resistor" 344 includes a capacitor C3 and a switch S. In one state, switch S couples capacitor C3 to the inverting input of the amplifier 240 and a voltage reference terminal 345 (for example, a ground terminal), such that the capacitor C3 establishes a DC potential at a junction of capacitor C1 and capacitor C2. Such configuration facilitates cancelling out frequency components (such as frequency component 204B) lower than a cutoff frequency of the capacitors C1, C2, and/or C3. The frequency circuit path 320 can thus maintain a high pass network in the depicted embodiment. In another state, switch S couples capacitor C3 with the output of the amplifier 240 and the voltage reference terminal 345. Alternatively, instead of implementing a switched-capacitor resistor, the frequency circuit path 320 can include a feedback resistor coupled with the output and inverting input of the amplifier 240 to establish the DC operating potential. Though the feedback resistor can achieve cancelling out of frequencies below its cutoff frequency, depending on design requirements, an equivalent resistance for achieving such may be relatively larger than desirable for the integrated circuit 300. Similar to the frequency circuit path 220, in frequency circuit path 320, the capacitive feedback amplifier receives and conditions (for example, amplifies) the frequency component 204A, thereby providing the conditioned signal 244 to the ADC 246. The ADC 246 converts the conditioned signal 244 (in the present example, a conditioned, high AC frequency component signal) into an equivalent digital signal, such as output signal 210A for subsequent processing, such as subsequent digital processing.

The frequency circuit path 330 is similar to the frequency circuit path 230 in many respects. For example, the frequency circuit path 330 includes the resistor-based circuit, such that the frequency path circuit 330 processes frequency component 204B (here, the low frequency component, which can include the DC frequency component and/or the low AC frequency component) of the input signal 204. For example, frequency circuit path 330 includes the resistor divider (alternatively referred to as a resistive attenuator) that includes resistor R1 and resistor R2 coupled in series with the node 212 and the voltage reference terminal 250. The resistor divider receives and conditions (for example, attenuates) the frequency component 204B, thereby providing the conditioned signal 252 to the ADC 256 coupled with the resistor divider. The resistor divider is configured to provide the conditioned signal 252 within a range of the ADC 256. In the depicted embodiment, the resistor divider attenuates (scales) the DC frequency component (and/or low AC frequency component), which is potentially large, such that the conditioned signal 252 has a magnitude suitable for subsequent digitization. The ADC 256 converts the conditioned signal 252 (in the present example, a conditioned, DC and/or low AC frequency component signal) into an equivalent digital signal, such as output signal 210B for subsequent processing, such as subsequent digital processing.

Since the input signal 204 has been separated into more than one frequency component for processing (here, frequency component 204A for processing by frequency circuit path 320 and frequency component 204B for processing by frequency circuit path 330), the integrated circuit 300 is further configured to combine the processed signal components so that the output signal 208 accurately represents the input signal 204. Because an internal gain of the frequency circuit path 320 and frequency circuit path 330 can be adjusted to optimize signal-to-noise ratio, and thus result in output signal 210A and output signal 210B having different levels of gain, the integrated circuit 300 is further configured to calibrate the "analog" gains (such as that associated with signal 244 and/or signal 252) of the frequency path circuits to correspond with their respective "digital" gains (such as that associated with output signal 210A and/or output signal 210B). For example, frequency circuit path 320 further includes a scaling circuit component 348 coupled with the ADC 246 that scales the output signal 210A, thereby providing output signal 310A; and frequency circuit path 330 further includes a filter 358 coupled with the ADC 358 that filters the output signal 210B, thereby providing output signal 310B. In frequency circuit path 320, the capacitive feedback amplifier amplifies frequency circuit component 204A to provide conditioned signal 244 above a noise floor of the ADC 246 so that ADC 246 can adequately convert the conditioned signal 244 to its equivalent digital signal (output signal 210A), and the scaling circuit component 348 rescales and restores the digital signal (output signal 210A) to supply output signal 310A having a same scale factor as the digital signal (output signal 310B) supplied by the frequency circuit path 330. Such configuration can ensure that the conditioned signal 244 is not corrupted by noise from the ADC 246 (thus allowing a configuration where the ADC 246 does not require such a large dynamic range) while further ensuring that the combined digital signals, output signal 310A and output signal 310B, have commensurate digital levels. In frequency circuit path 330, the filter 358 can include a low pass filter that passes low-frequency signals (such as the low AC frequencies), further ensuring that the frequency circuit path 330 passes the frequency component 204B.

The integrated circuit 300 also includes the circuit component 260, such as a summer, that combines output signal 310A (in the depicted embodiment, a digital signal representative of the high frequency component of the input signal 204) and output signal 310B (in the depicted embodiment, a digital signal representative of the low frequency component of the input signal 204) to produce the output signal 208 (in the depicted embodiment, a digital signal over a range of frequencies). In various implementations, the circuit component 260 includes a digital addition circuit. In the present example, the scaling circuit component 348 and the filter 358 can respectively ensure that the output signal 310A and the output signal 310B are commensurate, so that the circuit component 260 can add the output signal 310A with the output signal 310B to produce the output signal 208.

In furtherance of the depicted embodiment, where frequency circuit path 320 is essentially a high pass network and frequency circuit path 330 is essentially a low pass network, the integrated circuit 300 is further configured to combine the transfer function of frequency circuit path 320 with a transfer function of frequency circuit path 330, such that transition frequencies of the two paths are complementary, thereby achieving an overall result (output signal 208) that is all pass, without variations over frequency. For example, in the depicted embodiment, the switched-capacitor "resistor" 344 and the filter 358 are configured with a commensurate clocking frequency, such that the switched-capacitor resistor 344 (of frequency circuit path 320) operates with a commensurate clock as the filter 358 (of frequency circuit path 330). Such configuration results in the various frequency component characteristics cancelling out, making the overall, combined transfer function of the different frequency circuit paths insensitive to the clock rate chosen, and thereby supplying a smooth all pass response.

By separating the input signal 204 into more than one frequency component, the integrated circuit 300 can optimize signal processing for various frequency components, thereby improving signal processing, as described above with reference to integrated circuit 200 of FIG. 3. In particular, by providing frequency circuit paths optimized for various frequency components of an analog signal, the integrated circuit device 300 can optimize a resulting digital signal, such that it better represents the analog signal. The integrated circuit 300 can be configured to separate the input signal 204 into more than two frequency components as depicted, with at least two frequency circuit paths for processing the two or more frequency components of the incoming signal 204, where each frequency circuit path is optimized for a portion of the frequency spectrum. For example, the integrated circuit 200 can be configured to include frequency circuit path 320 for processing high AC frequencies, frequency circuit path 330 for processing DC frequencies, and another frequency path circuit for processing low AC frequencies. Alternatively, the integrated circuit 200 can be configured with frequency circuit paths optimized for processing different frequency components of the input signal 204, than those described with reference to FIG. 4. It is further noted that the integrated circuit 300 is configured as single-ended, yet the present disclosure contemplates configurations where the integrated circuit 300 operates with differential inputs.

Figure 5:
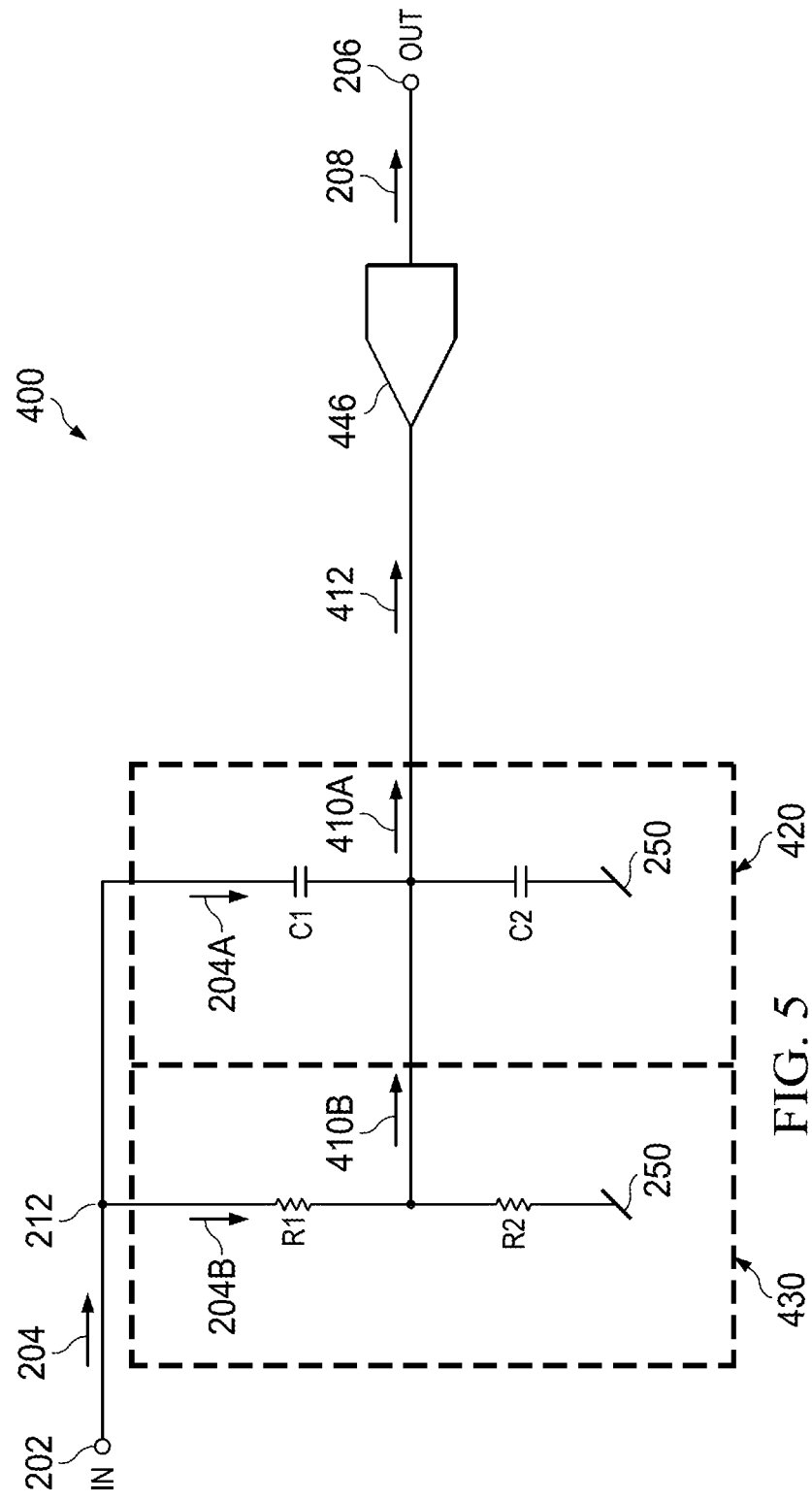
FIG. 5 is a simplified block diagram of yet another exemplary integrated circuit that provides a split-path data acquisition signal chain according to various aspects of the present disclosure.

FIG. 5 is a schematic circuit diagram of an exemplary integrated circuit 400 according to various aspects of the present disclosure. The integrated circuit 400 forms a data acquisition signal chain, in particular, a split-path data acquisition signal chain. In various implementations, the integrated circuit 400 is an electronic device (including an electronic circuit and/or one or more components) configured to convert signals (such as analog signals) into a digital form. The integrated circuit 400 can thus alternatively be referred to as a data acquisition system. The embodiment of FIG. 5 is similar in many respects to the embodiments of FIG. 3 and FIG. 4. Accordingly, similar features in FIGS. 3-5 are identified by the same reference numerals for clarity and simplicity. FIG. 5 has been simplified for the sake of clarity to better understand the inventive concepts of the present disclosure. For example, the integrated circuit 400 is configured as single-ended, yet the present disclosure contemplates configurations where the integrated circuit 400 operates with differential inputs. Additional features can be added in the integrated circuit 400, and some of the features described below can be replaced or eliminated in other embodiments of the integrated circuit 400.

Similar to the integrated circuit 200 and the integrated circuit 300, the integrated circuit 400 has the input terminal 202 that receives the input signal 204 and the output terminal 206 that outputs the output signal 208. In the depicted embodiment, the input signal 204 is an analog signal having various frequency components, for example, an AC (alternating current) frequency component and a DC (direct current) frequency component; and the output signal 208 is a digital signal. The integrated circuit 400 processes the input signal 204 to provide the output signal 208 in digital form to the output terminal 206. Further, the integrated circuit 400 is similarly configured to separate the frequency components of the input signal 204 (the frequency component 204A and the frequency component 204B) for processing, and then recombine the processed frequency components (here, an output signal 410A and an output signal 410B) to supply the output signal 208 to output terminal 206. For example, a frequency circuit path 420 and a frequency circuit path 430 are coupled with the input terminal 202 and the output terminal 206, and configured such that the input signal 204 is separated into the frequency component 204A and the frequency component 204B from node 212. Frequency circuit path 420 processes frequency component 204A, thereby providing output signal 410A, and frequency circuit path 430 processes frequency component 204B, thereby providing output signal 410B. In the depicted embodiment, frequency circuit path 420 is a high frequency circuit path that passes high frequencies and frequency circuit path 430 is a low frequency circuit path that passes low frequencies (frequencies lower than the frequencies passed by the frequency circuit path 420). For example, frequency circuit path 420 processes an AC frequency component, such as a high AC frequency component, of the input signal 204, and frequency circuit path 430 processes a DC frequency component of the input signal 204. In furtherance of the present example, frequency circuit path 430 can further process an AC frequency component, such as a low AC frequency component (frequencies between the DC frequency component and the high AC frequency component). Accordingly, in the present example, frequency component 204A represents the high AC frequency component of the input signal 204, and frequency component 204B represents the DC and low AC frequency component of the input signal 204.

Similar to integrated circuit 200 and integrated circuit 300, in integrated circuit 400, the frequency circuit path 420 includes a capacitor-based circuit that processes frequency component 204A (here, the high frequency component, which can include high AC frequencies) of the input signal 204, and the frequency circuit path 430 includes a resistor-based circuit, such that the frequency path circuit 430 processes frequency component 204B (here, the low frequency component, which can include the DC frequency component and/or the low AC frequency component) of the input signal 204. In the depicted embodiment, frequency circuit path 420 includes a capacitive divider (alternatively referred to as a capacitive attenuator) that includes a capacitor C1 and a capacitor C2 coupled in series with the node 212 and a voltage reference terminal 250 (for example, a ground terminal). The capacitive feedback amplifier receives and conditions (for example, attenuates) the frequency component 204A, thereby supplying conditioned output signal 410A. The capacitive divider does not pass the frequency component 204B, ensuring that the frequency circuit path 420 is a high pass network in the depicted embodiment. In furtherance of the depicted embodiment, frequency circuit path 430 includes a resistor divider (alternatively referred to as a resistive attenuator) that includes resistor R1 and resistor R2 coupled in series with the node 212 and the voltage reference terminal 250. The resistor divider receives and conditions (for example, attenuates) the frequency component 204B, thereby supplying the conditioned output signal 410B.

As described above, the integrated circuit 200 and the integrated circuit 300 are configured to convert the conditioned analog signals to equivalent digital signals in respective, separate frequency circuit paths, and then, recombine the equivalent digital signals of the separate frequency circuit paths to supply the output signal 208. In contrast, the integrated circuit 400 is configured to recombine the conditioned analog signals, and then, convert the combined, conditioned analog signal to an equivalent digital signal, thereby supplying the output signal 208 to the output terminal 206. For example, frequency circuit path 420 and frequency circuit path 430 are configured such that conditioned output signal 410A and conditioned output signal 410B are combined to provide conditioned signal 412 (here, a conditioned analog signal over a range of frequencies) to an analog-to-digital converter (ADC) 446. The ADC 446 then converts the conditioned signal 412 into an equivalent digital signal, such as output signal 208 for subsequent processing, such as subsequent digital processing.

The integrated circuit 400 provides a simplistic, minimal hardware approach (for example, a single ADC) for separating the input signal 204 into more than one frequency component to optimize signal processing for various frequency components, thereby improving signal processing. In particular, the integrated circuit 400 uses separate frequency circuit paths to optimize signal conditioning for the various frequency components. However, it is noted that though such configuration achieves desired signal processing improvements, in contrast to the integrated circuit 200 of FIG. 3 and the integrated circuit 300 of FIG. 4, the integrated circuit 400 is not configured to facilitate different gain settings for the different frequency circuit paths (such as an AC frequency circuit path and a DC frequency circuit path) to match signal characteristics or facilitate optimizing the ADC for a particular frequency component. Further, depending on design requirements, the crossover frequency (between the different frequency circuit paths) is constrained by the resistor and capacitor values, such that integrated noise from the resistors may be excessive for achieving desired high DC impedance.

A method that can be performed by the integrated circuit 200, integrated circuit 300, and/or integrated circuit 400 can include the following steps. The method begins by receiving an analog signal. The analog signal includes various frequency components. The method can continue by separating the analog signal into at least two frequency signal components. In various implementations, the at least two frequency signal components include an AC signal component and a DC signal component. In various implementations, the AC signal component includes high AC frequencies, and the DC signal component includes low AC frequencies and DC frequencies. The method continues by separately processing the at least two frequency signal components. In various implementations, the at least two frequency signal components are separately conditioned and converted to an equivalent digital signal. In various implementations, the at least two frequency signal components are separately conditioned. The method continues by combining the at least two frequency signal components after processing, thereby providing a digital signal. In various implementations, the equivalent digital signals of the at least two frequency signal components are combined to provide the digital signal. In various implementations, the conditioned signals of the at least two frequency signal components are combined and then converted to an equivalent digital signal to provide the digital signal. Additional steps can be provided before, during, and after the method and some of the steps described can be replaced or eliminated for other embodiments of the method.

In various implementations, data acquisition system 10, integrated circuit 100, integrated circuit 200, integrated circuit 300, and integrated circuit 400 of the FIGURES can be coupled with a motherboard of an associated electronic device or system. The motherboard can be a general circuit board that can hold various components of an internal electronic system of the electronic device and, further, provide connectors for other peripherals. More specifically, the motherboard can provide the electrical connections by which the other components of the system can communicate. Any suitable processors (inclusive of digital signal processors, microprocessors, supporting chipsets, etc.), memory elements, etc. can be suitably coupled with the motherboard based on particular configuration needs, processing demands, computer designs, other considerations, or a combination thereof. Other components, such as external storage, controllers for videos display, sound, and peripheral devices may be attached to the motherboard as plug-in cards, via cables, or integrated into the motherboard itself.

In the discussions of the embodiments above, the capacitors, buffers, graphics elements, filters, interconnect boards, clocks, ADCs, sensors, dividers, inductors, resistors, amplifiers, switches, digital core, transistors, and/or other components can readily be replaced, substituted, or otherwise modified in order to accommodate particular circuitry needs. Moreover, it should be noted that the use of complementary electronic devices, hardware, non-transitory software, etc. offer an equally viable option for implementing the teachings of the present disclosure.

In various implementations, data acquisition system 10, integrated circuit 100, integrated circuit 200, integrated circuit 300, and integrated circuit 400 of the FIGURES can be embedded in stand-alone modules (for example, a device with associated components and circuitry configured to perform a specific application or function) or integrated as plug-in modules into application specific hardware of electronic devices. Note that particular embodiments of the present disclosure may be readily included in a system-on-chip (SOC) package. An SOC represents an integrated circuit that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In other embodiments, the attenuation functions described herein may be implemented in one or more semiconductor cores (such as silicon cores) in application specific integrated circuits (ASICs), field programmable gate arrays (FPGAs), other semiconductor chips, or combinations thereof.

The specifications, dimensions, and relationships outlined herein have only been offered for purposes of example and teaching only. Each of these may be varied considerably without departing from the spirit of the present disclosure, or the scope of the appended claims. The specifications apply only to non-limiting examples and, accordingly, they should be construed as such. In the foregoing description, example embodiments have been described with reference to particular component arrangements. Various modifications and changes may be made to such embodiments without departing from the scope of the appended claims. The description and drawings are, accordingly, to be regarded in an illustrative rather than a restrictive sense.

Further, the operations and steps described with reference to the preceding FIGURES illustrate only some of the possible scenarios that may be executed by, or within, the various apparatuses, processors, devices, and/or systems, described herein. Some of these operations may be deleted or removed where appropriate, or these steps may be modified or changed considerably without departing from the scope of the discussed concepts. In addition, the timing of these operations may be altered considerably and still achieve the results taught in this disclosure. The preceding operational flows have been offered for purposes of example and discussion. Substantial flexibility is provided by the system in that any suitable arrangements, chronologies, configurations, and timing mechanisms may be provided without departing from the teachings of the discussed concepts.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "steps for" are specifically used in the particular claims; and (b) does not intend, by any statement in the specification, to limit this disclosure in any way that is not otherwise reflected in the appended claims.

What is claimed is:

1. An integrated circuit for providing a split-path data acquisition signal chain, the integrated circuit comprising:
    an input terminal for receiving an analog signal;
    an output terminal for outputting a digital signal; and
    a capacitor-based circuit path and a resistor-based circuit path configured to separate the analog signal into different frequency components, such that each of the circuit paths processes a different frequency component of the analog signal, the circuit paths further configured to recombine the processed, different frequency components to provide the digital signal.

2. The integrated circuit of claim 1 wherein:
    the capacitor-based frequency circuit path is configured to pass a high AC frequency component of the analog signal and block a DC frequency component of the analog signal; and
    the resistor-based frequency circuit path is configured to process the DC frequency component of the analog signal.

3. The integrated circuit of claim 1 wherein the capacitor-based circuit path includes a capacitive feedback amplifier.

4. The integrated circuit of claim 3 wherein the capacitive feedback amplifier includes:
    an operational amplifier having an inverting input, a non-inverting input, and an output;
    a first capacitor coupled with the input terminal and the inverting input;
    a second capacitor coupled with the inverting input and the output.

5. The integrated circuit of claim 4 wherein the capacitive feedback amplifier further includes a switched capacitor resistor coupled with the inverting input.

6. The integrated circuit of claim 3 wherein the capacitor-based circuit path further includes an analog-to-digital converter coupled with the capacitive feedback amplifier.

7. The integrated circuit of claim 1 wherein the resistor-based circuit path includes a resistor divider.

8. The integrated circuit of claim 7 wherein the resistor-based circuit path further includes an analog-to-digital converter coupled with the resistor divider.

9. The integrated circuit of claim 1 wherein the input terminal is configured to receive a differential analog signal.

10. An integrated circuit for providing a split-path data acquisition signal chain, the integrated circuit comprising:
   an input terminal for receiving an analog signal;
   an output terminal for receiving a digital signal;
   a capacitive-based circuit coupled with the input terminal and the output terminal, wherein the capacitive-based circuit is configured to process a first frequency component of the analog signal;
   a resistive-based circuit path coupled with the input terminal and the output terminal, wherein the resistive-based circuit path is configured to process a second frequency component of the analog signal; and
   wherein the capacitive-based circuit and the resistive-based circuit are coupled such that the processed first frequency component and the processed second frequency component are combined to provide the digital signal.

11. The integrated circuit of claim 10 wherein:
   the capacitive-based circuit includes:
      a capacitive feedback amplifier, and
      a first analog-to-digital converter coupled with the capacitive feedback amplifier; and
   the resistive-based circuit path includes:
      a resistor divider, and
      a second analog-to-digital converter coupled with the resistor divider.

12. The integrated circuit of claim 11 wherein:
   the capacitive-based circuit further includes a scaling component coupled with the first analog-to-digital converter; and
   the resistive-based circuit further includes a low pass filter coupled with the second analog-to-digital converter.

13. The integrated circuit of claim 12 wherein the capacitive-based circuit further includes a switched-capacitor resistor coupled with the capacitive feedback amplifier.

14. The integrated circuit of claim 13 wherein the switched-capacitor resistor and the low pass filter are configured to operate on a commensurate clock frequency.

15. The integrated circuit of claim 10 wherein the input terminal is configured to receive a differential analog signal.

16. The integrated circuit of claim 10 wherein the first frequency component includes a high AC frequency component of the analog signal and the second frequency component includes a DC frequency component of the analog signal.

17. The integrated circuit of claim 16 wherein the second frequency component further includes a low AC frequency component of the analog signal.

18. A method to be performed by an integrated circuit, the method comprising:
   receiving an analog signal;
   separating the analog signal into at least two frequency signal components for separate processing by a capacitor-based circuit and a resistive-based circuit; and
   combining the at least two processed frequency signal components to provide a digital signal.

19. The method of claim 18 wherein the separating the at least two frequency signal components include passing an AC signal component to the capacitor-based circuit and blocking a DC signal component from the capacitor-based circuit, such that the DC signal component is passed to the resistive-based circuit.

20. An integrated circuit for providing a split-path data acquisition signal chain, the integrated circuit comprising:
   capacitive-based means and resistive-based means for separating an analog signal into at least two frequency signal components, separately processing each of the at least two frequency signal components, and combining the at least two processed frequency signal components to provide a digital signal.

21. The integrated circuit of claim 20, wherein the capacitive-based means includes means for establishing a DC operating potential at an input of an amplifier.

\* \* \* \* \*